United States Patent [19]
Yoshida et al.

[11] Patent Number: 4,716,570
[45] Date of Patent: Dec. 29, 1987

[54] DISTRIBUTED FEEDBACK SEMICONDUCTOR LASER DEVICE

[75] Inventors: Toshihiko Yoshida, Tenri; Haruhisa Takiguchi; Shinji Kaneiwa, both of Nara; Sadayoshi Matsui, Tenri, all of Japan

[73] Assignee: Sharp Kabushiki Kaisha, Osaka, Japan

[21] Appl. No.: 816,259

[22] Filed: Jan. 6, 1986

[30] Foreign Application Priority Data

Jan. 10, 1985 [JP] Japan .................................. 60-3099
Feb. 7, 1985 [JP] Japan .................................. 60-23169

[51] Int. Cl.⁴ .................. H01S 3/19; H01S 3/08; H01L 29/161; H01L 29/205
[52] U.S. Cl. .................................. 372/45; 372/46; 372/48; 372/96; 357/16
[58] Field of Search .................. 372/45, 48, 44, 46, 372/96; 357/16

[56] References Cited

U.S. PATENT DOCUMENTS

| 4,233,090 | 11/1980 | Haurylo et al. | 357/16 |
| 4,553,239 | 11/1985 | Akiba et al. | 372/44 |
| 4,618,959 | 7/1986 | Mito | 372/46 |

FOREIGN PATENT DOCUMENTS

| 127892A | 7/1984 | Japan | 372/96 |
| 125685A | 7/1984 | Japan | 372/96 |
| 151483A | 8/1984 | Japan | 372/45 |

Primary Examiner—Eugene R. LaRoche
Assistant Examiner—Michael B. Shingleton
Attorney, Agent, or Firm—Birch, Stewart, Kolasch & Birch

[57] ABSTRACT

A distributed feedback semiconductor laser device comprising an active layer positioned between a first cladding layer and a second cladding layer, and an absorption layer positioned between the active layer and one of the cladding layers, the absorption layer having grooves to form a diffraction grating with a given periodicity in the direction of the propagation of laser light.

12 Claims, 3 Drawing Figures

DISTRIBUTED FEEDBACK SEMICONDUCTOR LASER DEVICE

BACKGROUND OF THE INVENTION

1. Field of the Invention

This invention relates to a distributed feedback semiconductor laser device, the absorption loss of which has been adjusted to the same periodicity as the wavelength of laser light in the direction of the propagation of the laser light, thereby allowing oscillation in a single longitudinal mode.

2. Description of the Prior Art

It has been found in recent years that distributed feedback semiconductor laser devices, the refractive index of which has been changed to match the periodicity of the wavelength of laser light in the direction of the propagation of the laser light, are an effective means for laser light oscillation in a single longitudinal mode. In a semiconductor laser with a distributed feedback the refractive index of which has been changed, there are essentially two longitudinal modes with equivalent gain. However, when uniform electrical current is injected into the device, that is, when device operation is under a steady state, oscillation is attained in only one longitudinal mode because of some asymmetrical characteristics of the resonator.

In most semiconductor laser devices with distributed feedback, the facets of both ends of the devices do not result in those of a Fabry-Perot resonator, but rather, one of the facets is etched diagonally, so that the asymmetry of the resonator is increased greatly, and stable single-mode oscillation can be achieved.

However, when the above-mentioned conventional semiconductor lasers with distributed feedback operate under an unsteady state where the excitation current is rapidly modulated as when they are being used as a light source for optical communication, the above-mentioned asymmetry of the resonator is probably changing constantly. Thus, oscillation is not necessarily in a single mode, and in practice it involves broadening of the oscillation spectrum and noncontinuous change in the oscillation mode.

SUMMARY OF THE INVENTION

The semiconductor laser device with a distributed feedback of this invention which overcomes the above-discussed and numerous other disadvantages and deficiencies of the prior art, comprises an active layer positioned between a first cladding layer and a second cladding layer, and an absorption layer positioned between the active layer and one of the cladding layers, the absorption layer having grooves to form a diffraction grating with a given periodicity in the direction of the propagation of laser light. A buffer layer having the same polarity as one of the cladding layers is, in a preferred embodiment, positioned between said active layer and said absorption layer.

In another preferred embodiment, the absorption layer has an energy gap which is equal to or is somewhat narrower than that of the active layer and has the same polarity as one of the cladding layers.

Alternatively, in a preferred embodiment, the absorption layer has a different polarity from that of one of the cladding layers and a reverse bias is applied to the junction at the interface between the buffer layer and the absorption layer, resulting in a current blocking structure having a diffraction grating with the same periodicity as the diffraction grating of the absorption layer.

Thus the invention described herein makes possible the objects (1) of providing a distributed feedback semiconductor laser device in which an absorption layer is disposed between the active layer and one of the two cladding layers to achieve a change of the absorption coefficient of laser light at the same periodicity as the wavelength of the laser light in the direction of the propagation of the laser light thereby allowing for the existence of only one longitudinal mode with maximum gain, so that the laser device can oscillate in a single longitudinal mode in operation not only under a steady state but also under an unsteady state , and neither broadening of the oscillation spectrum nor noncontinuous change in the oscillation mode arise; (2) a distributed feedback semiconductor laser device in which, since a buffer layer with a limited thickness is disposed between the active layer and the absorption layer, laser light is sensitive enough to the periodic structure of the absorption layer to be oscillated in a single longitudinal mode; (3) a distributed feedback semiconductor laser device in which reverse bias voltage is applied to the heterojunction at the interface between the buffer layer and the absorption layer to achieve a change of the absorption coefficient of the laser light at the same periodicity as the wavelength of the laser light in the direction of the propagation of the laser light thereby attaining oscillation in a single longitudinal mode even in operation under an unsteady state; and (4) a distributed feedback semiconductor laser device which attains stabilized oscillation of high output power laser light which can be used as a light source for optical communication.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The semiconductor laser device of this invention is a distributed feedback semiconductor laser device of a double heterostructure type designed in such a manner that an absorption layer, having a limited thickness with a regular periodicity along the direction of the propagation of laser light, is disposed between the active layer and one of the cladding layers, thereby achieving a change of gain or the absorption coefficient to match the periodicity of the wavelength of the laser light. In this distributed feedback semiconductor laser device, there is only one longitudinal mode with maximum gain, and oscillation is attained in a single longitudinal mode even in operation under an unsteady state where the excitation current is rapidly modulated as when it is being used as a light source for optical communication. Distributed feedback semiconductor laser devices in which the gain or the absorption coefficient changes periodically have not been proposed.

EXAMPLE 1

Figure 1:
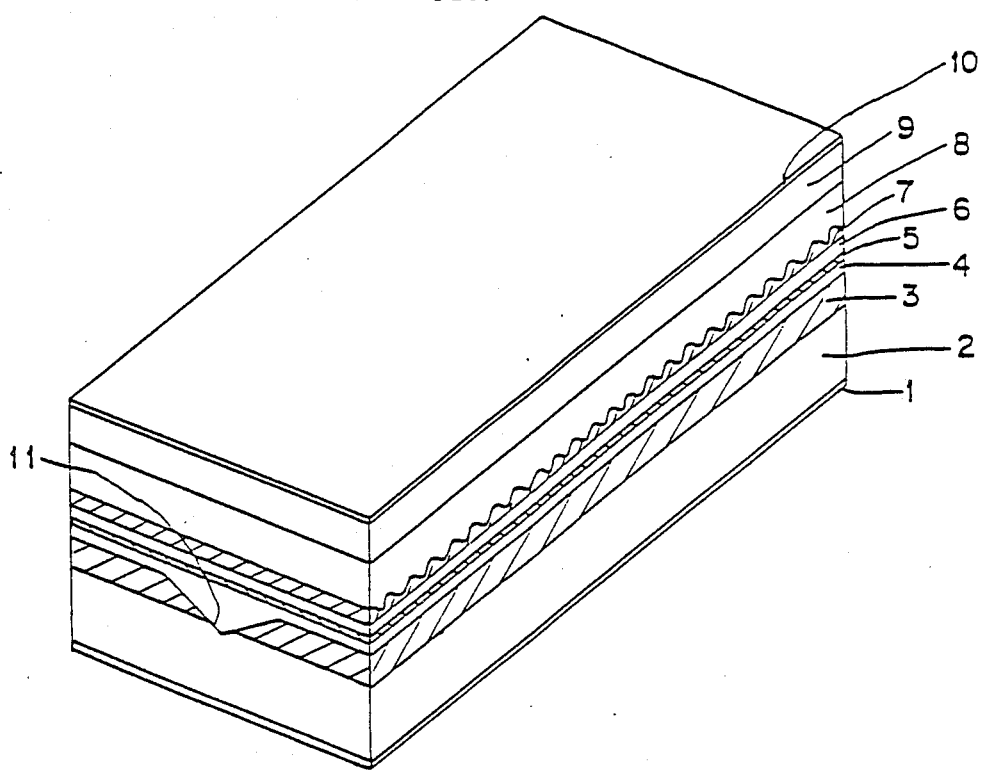
FIG. 1 is a perspective view showing a distributed feedback semiconductor laser device of this invention.

FIG. 1 shows a distributed feedback semiconductor laser device of this invention, which is produced as follows: On a p-GaAs substrate 2, an n-GaAs current blocking layer 3 is grown by liquid phase epitaxy, followed by etching with an etchant ($H_2SO_4:H_2O_2:H_2O=1:2:50$) in such a manner that a V-shaped channel 11 reaches the p-GaAs substrate 2 by the use of a photo-resist mask (not shown). On the current blocking layer 3 including the channel 11, a p-$Ga_{0.75}Al_{0.25}As$ cladding layer (the first cladding layer) 4, a $Ga_{0.99}Al_{0.01}As$ active layer 5, an n-$Ga_{0.75}Al_{0.25}As$ buffer layer 6 and an n-GaAs absorption layer 7 are successively grown by liquid phase epitaxy.

The energy gap of the GaAs absorption layer 7 is smaller than that of any $Ga_xAl_{1-x}As$ layer (namely, the energy gap Eg of the GaAs absorption layer 7 is smaller than that of the $Ga_{0.99}Al_{0.01}As$ active layer 5), and accordingly the resulting laser light resonator has an effective absorption coefficient. The buffer layer 6 is not necessarily required, but when it is formed with a limited thickness, a desired oscillation in a single longitudinal mode can be attained even in operation under an unsteady state as described in detail below.

Then, a photo-resist is coated on the n-GaAs absorption layer 7 to form a photo-resist mask in the form of a diffraction grating with the same periodicity as the wavelength of laser light by means of a holographic exposing system (not shown). The GaAs absorption layer 7 is then etched with an etchant (ethylene glycol ($C_2H_6O_2$):$H_3PO_4$:$H_2O_2$=8:1:1) to form diffraction grating shaped grooves with the same periodicity (i.e., center-to-center spacing) as the wavelength of laser light in the direction of the propagation of the laser light. None of the grooves should pass through the absorption layer 7, because the buffer layer 6 is composed of a GaAlAs layer and once it is exposed to air it is oxidized to thereby make it difficult to be subjected to the subsequent liquid phase epitaxial treatment. Then, on the etched absorption layer 7, an n-$Ga_{0.75}Al_{0.25}As$ cladding layer (the second cladding layer) 8 and an n-GaAs cap layer 9 are successively grown by liquid phase epitaxy. Electrodes 1 and 10 are formed on the back face of the substrate 2 and on the upper face of the cap layer 9, respectively, by vacuum evaporation.

The influence of the laser light on the periodic structure of the above-mentioned absorption layer 7 depends upon both the amplitude at the point of the periodical change of the thickness of the absorption layer 7 and the thickness of the buffer layer 6. When the thickness of the buffer layer 6 is extremely thin, the laser light becomes sensitive to the periodic structure of the absorption layer 7, but the laser light is absorbed to a large extent in the optical waveguide so that the threshold current level for oscillation will become high. Such an undesirable phenomenon can be prevented if the thickness of the absorption layer 7 is sufficiently thin. However, it is desirable that the amplitude at the point of the periodical change of the thickness of the absorption layer 7 is great. For example, when the center-to-center spacing of the diffraction grating of the absorption layer 7 is 2400 Å, the amplitude must be 800 Å at maximum. However, the formation of the buffer layer 6 with a limited thickness makes it possible to make the laser light sensitive to the periodic structure of the absorption layer 7, so that oscillation in a single longitudinal mode can be attained even in operation under an unsteady state. This is because the absorption coefficient of the device changes to the same center-to-center spacing as the wavelength of the laser light in the direction of the propagation of the laser light and thus there is only one longitudinal mode with maximum gain.

EXAMPLE 2

Figure 2:
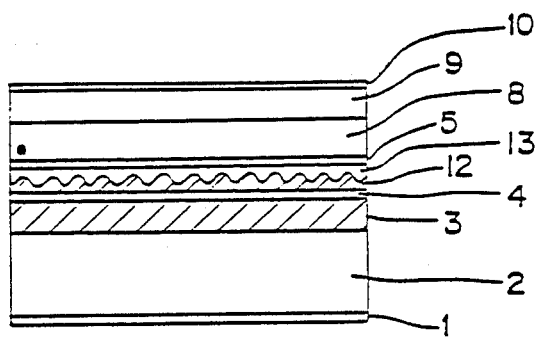
FIG. 2 is a side view showing another distributed feedback semiconductor laser device of this invention in which the absorption layer 12 is positioned under the active layer 5.

FIG. 2 shows another semiconductor laser device of this invention, which is the same structure as disclosed in Example 1 except that the p-GaAlAs buffer layer 13 and the p-GaAs absorption layer 12 are positioned under the active layer 5. The polarity of the GaAs absorption layer 12 must be the same p-type as that of the p-$Ga_{0.75}Al_{0.25}As$ cladding layer (the first cladding layer) 4.

Although each of the above-mentioned Examples 1 and 2 discloses only an inner striped GaAlAs/GaAs double-heterostructure semiconductor laser device, it is not limited thereto. Semiconductor laser devices using other materials such as InGaAsP/InP, etc., can be applied. Also, semiconductor laser devices having the same sectional view as a buried type laser device can be applied.

EXAMPLE 3

Figure 3:
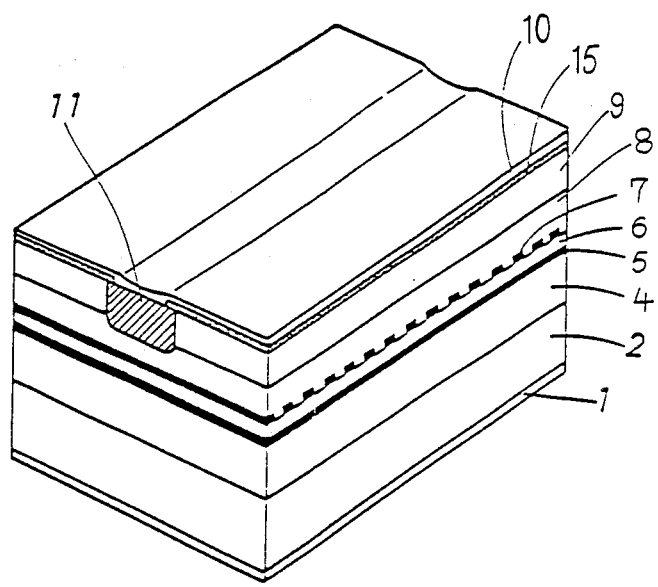
FIG. 3 is a perspective view showing another distributed feedback semiconductor laser device of this invention.

FIG. 3 shows another distributed feedback semiconductor laser device of this invention, which comprises a first n-InP cladding layer 4, an $In_xGa_{1-x}As_yP_{1-y}$ (0.47<x<1 and 0<y<1) active layer 5, a p-InP buffer layer 6, an n-InP absorption layer 7 formed in a diffraction grating and a second p-InP cladding layer 8, in sequence. A reverse bias is applied to the junction at the interface between the p-InP buffer layer 6 and the n-InP absorption layer 7.

All of the p-InP buffer layer 6, the n-InP absorption layer 7 and the p-InP cladding layer 8 are not necessarily of the same materials, but the p-InP buffer layer 6 must be the same polarity as the p-InP cladding layer 8 and the energy gap of each of the buffer layer 6 and the cladding layer 8 must be greater than that of the active layer 5. The polarity of the absorption layer 7 must be different from that of each of the InP buffer layer 6 and the InP cladding layer 8.

This semiconductor laser device is produced as follows: On an n-InP substrate 2, the first n-InP cladding layer 4, the active layer 5 having the composition ratio required to create an oscillation wavelength ranging from approximately 1.1 μm to approximately 1.6 μm, the p-InP buffer layer 6 having a thickness of approximately 0.08 μm and the n-InP absorption layer 7 having a thickness of approximately 0.1 μm are successively grown by liquid phase epitaxy. Then, a photo-resist is coated on the n-InP absorption layer 7 to form a photo-resist mask (not shown) in the form of a diffraction grating with the same periodicity as the wavelength of laser light by the exposure of an interference fringe pattern with a center-to-center spacing in a range of 1700 Å to 2500 Å by means of a holographic exposing system or the like. The n-InP absorption layer 7 is then etched into a grating with an etchant (saturated bromine water:$H_3PO_4$:$H_2O$=2:1:15). On the etched n-InP absorption layer 7, the second p-InP cladding layer 8 and an n-InP cap layer 9 are successively grown, followed by a plasma chemical vapor deposition treatment to form a SiNx film 15 having a thickness of approximately 2000 Å. The SiNx film 15 is then etched with an etchant (HF:NH₄F=1:40) using a photo-resist mask (not shown) so that the stripe in the direction of the propagation of laser light is removed. An impurity element such as Zn is then diffused into the cap layer 9 and the cladding layer 8 to form a p-channel 11 functioning as an electric current path while the SiNx film 15 is used as a diffusion mask. Then, electrodes 1 and 10 are formed on the upper face of the SiNx film 15 including the channel 11 and the back face of the substrate 2, respectively, resulting in a distributed feedback semiconductor laser device.

When a reverse bias is applied to the junction at the interface between the p-InP buffer layer 6 and the n-InP absorption layer 7 while the electrode 10 is maintained at positive potential against the electrode 1, an electric current blocking structure is formed into a grating at the junction area so that gain of the active layer 5 varies in magnitude corresponding to the diffraction grating of the n-InP absorption layer 7. That is, the portions of the active layer 5 corresponding to the convex portions of the absorption layer 7 exhibit lower gain than the other portions of the active layer 5 corresponding to the grooved portions of the absorption layer 7. Due to the reduction of gain in the active layer, the semiconductor laser device of this invention achieves oscillation in a stabilized single longitudinal mode in operation not only under a steady state but also under an unsteady state.

Although the above-mentioned Example 3 discloses only an InP/InGaAsP/InP double-heterostructure semiconductor laser device, it is not limited thereto. Other semiconductor laser devices such as GaAlAs/GaAs/GaAlAs double-heterostructure semiconductor laser devices can be applied.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A distributed feedback semiconductor laser device comprising: an active layer positioned between a first cladding layer and a second cladding layer, wherein an absorption layer is positioned between said active layer and one of said cladding layers, said absorption layer having grooves to form a diffraction grating with a given periodicity in the direction of the propagation of laser light.

2. A distributed feedback semiconductor laser device according to claim 1, wherein a buffer layer having the same polarity as one of the cladding layers is positioned between said active layer and said absorption layer.

3. A distributed feedback semiconductor laser device according to claim 1, wherein said absorption layer has an energy gap which is equal to or is somewhat narrower than that of said active layer and said absorption layer has the same polarity as one of said cladding layers.

4. A distributed feedback semiconductor laser device according to claim 2, wherein said absorption layer has a different polarity from that of one of said cladding layers and wherein a reverse bias is applied to the junction at the interface between said buffer layer and said absorption layer, resulting in a current blocking structure having a diffraction grating with the same periodicity as the diffraction grating of said absorption layer.

5. A distributed feedback semiconductor laser device according to claim 2, wherein said absorption layer has an energy gap which is equal to or is somewhat narrower than that of said active layer and has the same polarity as one of said cladding layers.

6. A distributed feedback semiconductor laser device according to claim 1, wherein said active layer is disposed on said first cladding layer, said absorption layer is disposed on said active layer, said second cladding layer is disposed on said absorption layer, and wherein said absorption layer has an energy gap which is equal to or somewhat narrower than that of said active layer.

7. A distributed feedback semiconductor laser device according to claim 6, wherein said first cladding layer is disposed on a current blocking layer, said current blocking layer is disposed on a substrate, a first electrode is disposed on said substrate, a cap layer is disposed on said second cladding layer, and a second electrode is disposed on said cap layer, and wherein said current blocking layer contains a V-channel that reaches said substrate.

8. A distributed feedback semiconductor device according to claim 6, wherein a buffer layer having the same polarity of one of said cladding layers is positioned between said absorption layer and said active layer.

9. A distributed feedback semiconductor device according to claim 3, wherein said absorption layer is disposed on said first cladding layer, a buffer layer is disposed on said absorption layer, said active layer is disposed on said buffer layer, said second cladding layer is disposed on said active layer, and wherein said absorption layer has the same polarity as said first cladding layer.

10. A distributed feedback semiconductor device according to claim 9, wherein said first cladding layer is disposed on a current blocking layer, said current blocking layer is disposed on a substrate, a first electrode is disposed on said substrate, a cap layer is disposed on said second cladding layer, a second electrode is disposed on said cap layer, and wherein said current blocking layer contains a V-channel that reaches said substrate.

11. A distributed feedback semiconductor device according to claim 4, wherein said active layer is disposed on said first cladding layer, said buffer layer is disposed on said active layer, said absorption layer is disposed on said buffer layer, said second cladding layer is disposed on said absorption layer, and
   wherein said buffer layer has the same polarity as that of said second cladding layer, said buffer layer and said second cladding layer having an energy gap greater than that of said active layer and having a polarity different from said absorption layer.

12. A distributed feedback semiconductor device according to claim 11, wherein said first cladding layer is disposed on a substrate, a first electrode is disposed on said substrate, a cap layer is disposed on said second cladding layer, a diffusion mask layer is disposed on said cap layer, a second electrode is disposed on said diffusion mask layer, and wherein said second cladding layer and said cap layer contain a p-channel functioning as an electric current path.

* * * * *